United States Patent
Lin et al.

(10) Patent No.: US 7,732,233 B2
(45) Date of Patent: Jun. 8, 2010

(54) METHOD FOR MAKING LIGHT EMITTING DIODE CHIP PACKAGE

(75) Inventors: Hung-Yi Lin, Tao-Yuan Hsien (TW);
Kuan-Jui Huang, Kao-Hsiung Hsien (TW); Yen-Ting Kung, Taoyuan County (TW); She-Fen Tien, Hsinchu County (TW)

(73) Assignee: Touch Micro-System Technology Corp., Yang-Mei, Taoyuan Hsien (TW)

( * ) Notice: Subject to any disclaimer, the term of this patent is extended or adjusted under 35 U.S.C. 154(b) by 0 days.

(21) Appl. No.: 12/481,578

(22) Filed: Jun. 10, 2009

(65) Prior Publication Data

US 2009/0267108 A1    Oct. 29, 2009

Related U.S. Application Data

(63) Continuation-in-part of application No. 11/611,892, filed on Dec. 18, 2006, now abandoned, and a continuation-in-part of application No. 11/612,486, filed on Dec. 19, 2006, and a continuation-in-part of application No. 11/612,490, filed on Dec. 19, 2006, now abandoned, and a continuation-in-part of application No. 11/612,491, filed on Dec. 19, 2006, now abandoned.

(30) Foreign Application Priority Data

Jul. 24, 2006    (TW)    ............... 95126950 A
Sep. 17, 2008    (TW)    ............... 97135619 A

(51) Int. Cl.
*H01L 21/00*    (2006.01)

(52) U.S. Cl. ............... 438/28; 438/26; 438/637; 257/E21.506

(58) Field of Classification Search ............... 257/69, 257/99, 100, 690, E33.065, E33.059, E33.057, 257/E21.507; 438/26, 28, 637, 667
See application file for complete search history.

(56) References Cited

U.S. PATENT DOCUMENTS

| | | |
|---|---|---|
| 3,942,245 A | 3/1976 | Jackson |
| 5,024,966 A | 6/1991 | Dietrich |
| 5,647,122 A | 7/1997 | Launay |
| 6,126,276 A | 10/2000 | Davis |
| 6,282,094 B1 | 8/2001 | Lo |
| 6,531,328 B1 | 3/2003 | Chen |
| 6,599,768 B1 | 7/2003 | Chen |
| 6,600,231 B2 | 7/2003 | Tominaga |
| 6,861,284 B2 | 3/2005 | Higashi |
| 6,970,612 B2 | 11/2005 | Ouchi |
| 7,022,553 B2 | 4/2006 | Ahn |

(Continued)

FOREIGN PATENT DOCUMENTS

WO    2004105142 A1    12/2004

*Primary Examiner*—Lex Malsawma
*Assistant Examiner*—Robert Huber
(74) *Attorney, Agent, or Firm*—Winston Hsu

(57) ABSTRACT

The LED chip package of the present invention uses a semiconductor substrate as package substrate, which improves heat dissipation. Also, the LED chip package is incorporated with a planarization structure, which renders the LED chip and the substrate a substantially planar surface, thereby making formation of a planar patterned conductive layer possible. Accordingly, serial/parallel electrical connections between light emitting diode chips can be easily implemented by virtue of the planar patterned conductive layer.

13 Claims, 15 Drawing Sheets

U.S. PATENT DOCUMENTS

| | | |
|---|---|---|
| 7,326,907 B2 | 2/2008 | Shibayama |
| 2002/0163006 A1 | 11/2002 | Yoganandan et al. |
| 2002/0171090 A1* | 11/2002 | Oohata et al. .................. 257/88 |
| 2004/0065894 A1* | 4/2004 | Hashimoto et al. .......... 257/100 |
| 2005/0029535 A1 | 2/2005 | Mazzochette |
| 2006/0040417 A1 | 2/2006 | Eldridge |
| 2006/0076571 A1 | 4/2006 | Hsieh |
| 2006/0124953 A1 | 6/2006 | Negley |
| 2006/0208271 A1 | 9/2006 | Kim |
| 2007/0238328 A1 | 10/2007 | Ferstl |
| 2008/0179602 A1* | 7/2008 | Negley et al. .................. 257/88 |
| 2008/0179613 A1 | 7/2008 | Wendt |

* cited by examiner

US 7,732,233 B2

METHOD FOR MAKING LIGHT EMITTING DIODE CHIP PACKAGE

CROSS REFERENCE TO RELATED APPLICATIONS

This application is a continuation-in-part of applicant's earlier applications, Ser. No. 11/611,892, filed Dec. 18, 2006, Ser. No. 11/612,486, filed Dec. 19, 2006, Ser. No. 11/612,490, filed Dec. 19, 2006, Ser. No. 11/612,491, filed Dec. 19, 2006, the entireties of which are incorporated by reference.

BACKGROUND OF THE INVENTION

1. Field of the Invention

The present invention is related to a light emitting diode (LED) chip package and the method of making the same, and more particularly, to an LED chip package utilizing a semiconductor substrate as a package substrate and able to fulfill electrical connection of a plurality of LEDs in series or in parallel easily and a wafer level packaging method of LED chip.

2. Description of the Prior Art

There are mainly two kinds of conventional Surface Mount Device (SMD) LED packaging methods: one of which utilizes a leadframe made of metal materials as a package substrate and the LED chip is mounted on the leadframe; the other method utilizes a printed circuit board (PCB) as a package substrate and the LED chip is mounted on the PCB.

FIG. 1 is a schematic view of a conventional LED chip package utilizing leadframe as a package substrate. As shown in FIG. 1, the conventional LED chip package 1 includes a base 2 formed by injection molding technique, and a leadframe 3 immobilized on the base 2 to form a package substrate 4. The LED chip 5 is mounted on the leadframe 3, and encapsulated on the package substrate 4 with package resin 6. One of the electrodes of LED chip 5 is directly electrically connected to the leadframe 3 located on one side of the package substrate 4, while another electrode is electrically connected to the leadframe 3 on the other side of the package substrate 4 via bonding wire 7 by wire bonding technique.

FIG. 2 is a schematic view of another conventional LED chip package utilizing PCB as a package substrate. As shown in FIG. 2, the conventional LED chip package 10 utilizes PCB 11, made of plastic, as a base, and wires 12 made of copper are laid on the PCB 11. The LED chip 13 is mounted on the PCB 11 and encapsulated with package resin 14, wherein one of the electrodes of the LED chip 13 is directly electrically connected to the wire 12 on one side of the PCB 11, and the other electrode is electrically connected to the wire 12 on the other side of the PCB 11 via the bonding wire 15 by wire bonding technique.

However both of the above mentioned conventional LED chip packages share common shortcomings listed as follows. First, the heat dissipation efficiency of conventional LED chip package is low. Whether the LED chip package is a leadframe type or a PCB type, the package substrate and the package resin are poor heat dissipation materials such as plastic or resin, and heat produced while light is emitted by the LED chips may not be quickly and efficiently dissipated. The accumulated heat would lead to increased temperature of the LED chip and therefore influence the illumination efficiency and life span of the LED chip. In addition, the conventional LED chip package utilizes bonding wire formed by the wire bonding technique to implement external electrical connection of the LED chip. However, the bonding wire itself must have a certain arch that has a height higher than the LED chip; hence the fabrication of the lens to be formed would be difficult.

SUMMARY OF THE INVENTION

It is therefore one of the objectives of the present invention to provide an LED chip package and a fabrication method thereof to increase heat dissipation efficiency, and to improve the facility of realize the serial/parallel electrical connection of LEDs.

To achieve the above-mentioned goal, a method of fabricating an LED chip package is provided. The method of fabricating an LED chip package includes:

providing a package substrate and forming a plurality of concave chip mounting areas on an upper surface of the package substrate;

forming a lower patterned conductive layer on the upper surface of the package substrate, wherein the lower patterned conductive layer comprises a plurality of first lower patterned conductive layers and a plurality of second lower patterned conductive layers;

providing a plurality of LED chips, each of the LED chips comprising a light emitting layer, a first conductive type doped semiconductor layer disposed on a lower surface of the light emitting layer, and a second conductive type doped semiconductor layer disposed on an upper surface of the light emitting layer mounting each of the LED chips within each of the chip mounting areas, and electrically connecting the first conductive type doped semiconductor layer of each of the LED chips to each of the first lower patterned conductive layers of the lower patterned conductive layer;

forming a planarization structure on the package substrate, the lower patterned conductive layer and the LED chips, and forming a plurality of contact holes in the planarization structure, wherein the contact holes partially expose the second conductive type doped semiconductor layer of each of the LED chips and partially expose each of the second lower patterned conductive layers of the lower patterned conductive layer; and forming an upper patterned conductive layer on the planarization structure and filling the upper patterned conductive layer into the contact holes so that each of the second lower patterned conductive layers of the lower patterned conductive layer and the second conductive type doped semiconductor layer of each of the LED chips are electrically connected via the upper patterned conductive layer.

To achieve the above-mentioned goal, an LED chip package is further provided. The LED chip package includes:

a package substrate comprising at least a concave chip mounting area disposed on an upper surface of the package substrate;

a lower patterned conductive layer disposed on the upper surface of the package substrate, wherein the lower patterned conductive layer comprises at least a first lower patterned conductive layer and at least a second lower patterned conductive layer;

at least an LED chip disposed within the chip mounting area, wherein the LED chip comprises a light emitting layer, a first conductive type doped semiconductor layer disposed on a lower surface of the light emitting layer, and a second conductive type doped semiconductor layer disposed on an upper surface of the light emitting layer, and the first conductive type doped semiconductor layer is electrically connected to the first lower patterned conductive layer of the lower patterned conductive layer;

a planarization structure, having a planar surface, disposed on the package substrate, the lower patterned conductive layer and the LED chip, the planarization structure comprising a plurality of contact holes, wherein the contact holes partially expose the second conductive type doped semiconductor layer of the LED chip and partially expose the second lower patterned conductive layer of the lower patterned conductive layer; and an upper patterned conductive layer disposed on the planarization structure and filled into the contact holes, wherein the second lower patterned conductive layer of the lower patterned conductive layer and the second conductive type doped semiconductor layer of the LED chip are electrically connected via the upper patterned conductive layer.

Since a semiconductor substrate is utilized as the package substrate in the LED chip package of the present invention, heat dissipation efficiency may be enhanced. Additionally, a planarization structure is disposed in the LED chip package of the present invention; therefore a planar patterned conductive layer may be formed on the planarization structure, which facilitates the electrical connection between LED chips in series/in parallel.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
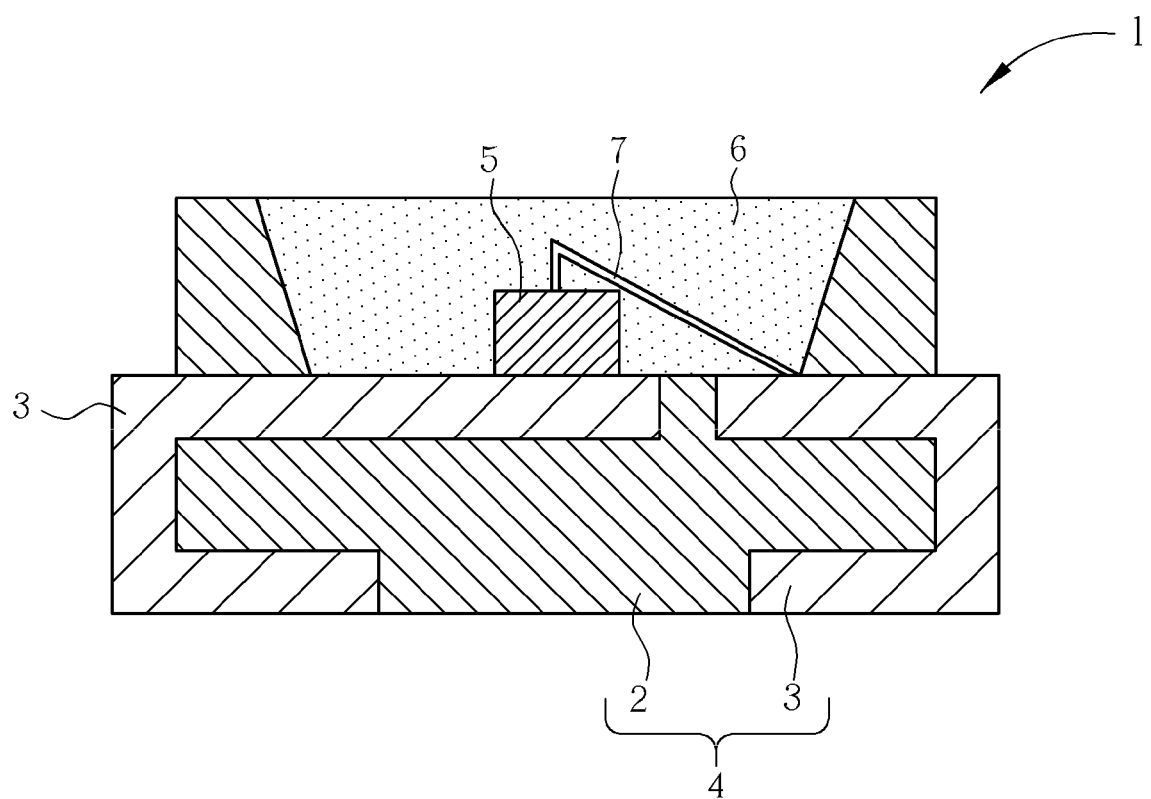
FIG. 1 is a schematic view of a conventional LED chip package utilizing leadframe as a package substrate.
Figure 2:
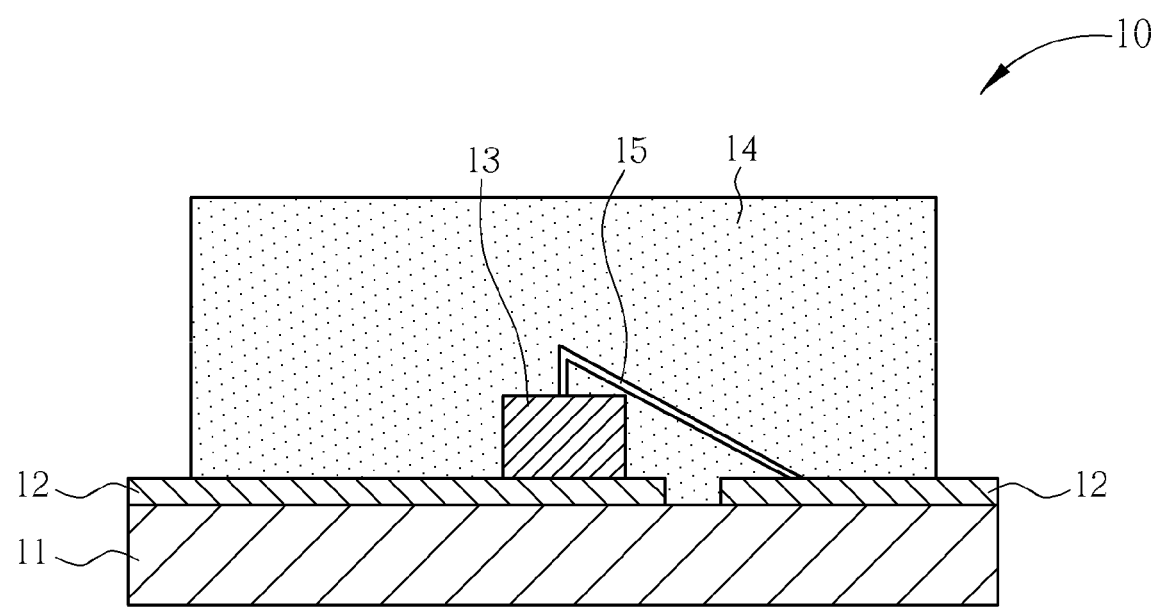
FIG. 2 is a schematic view of another conventional LED chip package utilizing PCB as a package substrate.

To provide a better understanding of the presented invention, preferred embodiments will be made in details. The preferred embodiments of the present invention are illustrated in the accompanying drawings with numbered elements.

Please refer to FIG. 3 to FIG. 12. FIG. 3 to FIG. 12 are schematic views of a method of making an LED chip package according to a preferred embodiment of the present invention. FIG. 3a to FIG. 12a are either top views or bottom views, while FIG. 3b to FIG. 12b and FIG. 4c are cross-sectional views. As shown in FIG. 3a and FIG. 3b, a package substrate 30 having a plurality of units U defined thereon is provided at first. In the present embodiment, the thickness of the package substrate 30 is about 500 micrometers (μm), but is not limited to the thickness. The package substrate 30 may be a semiconductor substrate, for instance a silicon substrate, gallium arsenide (GaAs) substrate, or other substrates with good heat conductivity suitable for batch production (large scale production), and compatible with semiconductor fabrication process. Next, a plurality of concave chip mounting areas 32 are formed on the upper surface of the package substrate 30 by photolithography and etching technique. Each of the chip mounting areas 32 is substantially located in the middle of the corresponding unit U, and the area of the chip mounting areas 32 is substantially half of the area of the unit U, but not limited. In the present embodiment, it is preferred to use silicon substrate as the package substrate 30 for its (1,0,0) lattice structure, for instance. When the silicon substrate has (1,0,0) lattice structure, an anisotropic wet etching process using potassium hydroxide (KOH) solution, tetramethylammonium hydroxide (TMAH) solution or ethylenediamine pyrocatechol (EDP) solution as etchant solution may be used. The etching would proceed along the direction of the lattice structure, such that the chip mounting areas 32 may have an outwardly-inclined side wall, which has an included angle of substantially 54.7 degrees with the bottom of the chip mounting areas 32. The outwardly-inclined side wall is beneficial to the fabrication of the conductive wire layer to be formed later on. The above mentioned etching process is not limited to anisotropic wet etching process and may be other wet etching process or dry etching process. The included angle of the side wall and the bottom of the chip mounting areas 32 is not limited to 54.7 degrees and may be adjusted to meet other requirements. In addition, the depth of the chip mounting areas 32 is close to the thickness of the LED chip to be mounted within the chip mounting areas 32. Thus, the depth of the chip mounting areas 32 may vary depending on the thickness of the LED chip, and lies e.g. from several to several tens of micrometers. For instance, the preferred depth of the chip mounting areas 32 is in between 10 μm to 50 μm, but is not limited to the above mentioned range.

Figure 3A:
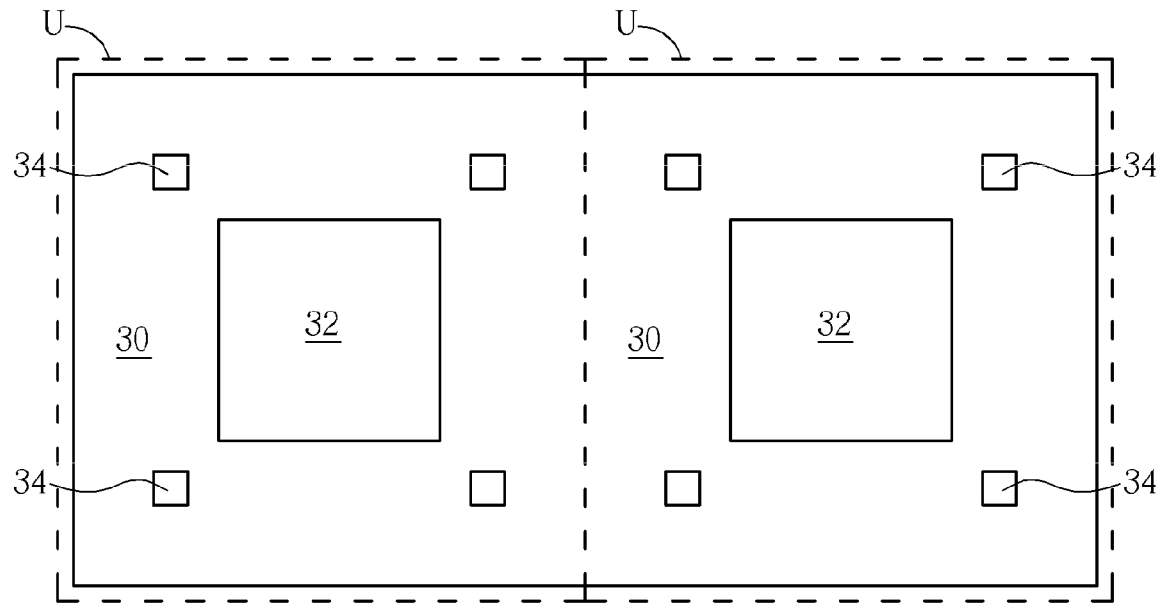
FIG. 3 to FIG. 12 are schematic views of a method of making an LED chip package according to a preferred embodiment of the present invention.
Figure 3B:
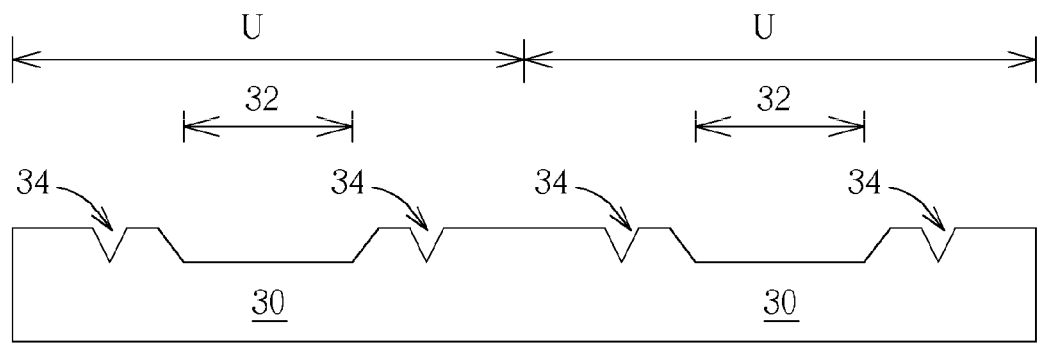

In the LED chip package of the present invention, the LED chip may be selectively electrically connected to the lower surface of the package substrate 30 via through holes of the package substrate 30, so as to facilitate external electrical connection. Thus, a step of fabricating through holes may be included in the present method. The step is detailed as follows. In the present embodiment, the through holes of the package substrate 30 includes upper through holes and lower through holes conducting to each other. The upper through holes are fabricated by means of various types of dry or wet etching techniques from the upper surface of the package substrate 30, while the lower through holes corresponding to the upper through holes are fabricated by means of various types of dry or wet etching techniques from the lower surface of the package substrate 30. The step of fabricating the upper through holes includes performing an etching process to form a plurality of upper through holes 34 on the upper surface of the package substrate 30. The side wall of the upper through holes 34 is preferably outwardly inclined so as to facilitate successive fabrication of the conductive wire, but the side wall is not limited to be outwardly inclined. The etching process of fabricating the upper through holes 34 may be integrated into the etching process of fabricating the chip mounting areas 32. In other words, the chip mounting areas 32 and the upper through holes 34 may be simultaneously formed in the same photolithography and etching process. Since the size of the upper through holes 34 is smaller than the size of the chip mounting areas 32, each of the upper through holes 34 looks like a cone-shaped holes as shown in FIG. 3b.

Figure 4A:
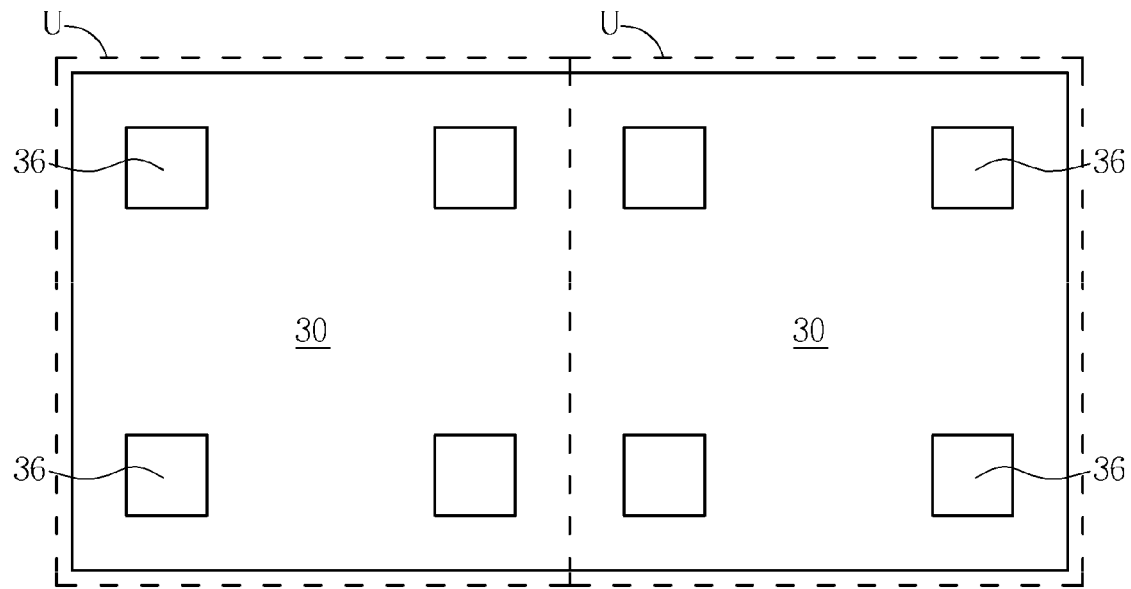
Figure 4B:
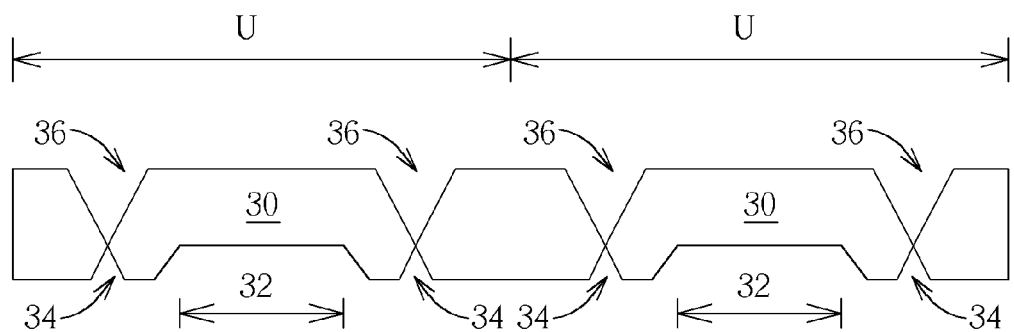
Figure 4C:
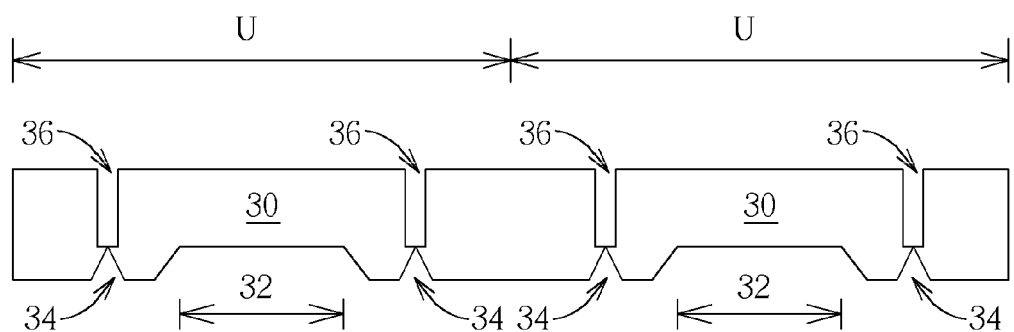

As shown in FIG. 4a and FIG. 4b, a plurality of lower through holes 36 are formed on the lower surface of the package substrate 30 corresponding to the location of the upper through holes 34 by photolithography and etching technique. The steps of forming the upper through holes 34 and the lower through holes 36 are not limited to be in particular order and may be altered according to the requirements of processes. Each of the lower through holes 36 may have similar shapes as the upper through holes 34, and form a through hole that penetrate through the package substrate 30 with the corresponding upper through hole 34. The depth of the lower through holes 36 and the size of the lower through holes are deeper than the depth of the upper through holes 34 and the size of the upper through holes 34 in FIG. 4a and FIG. 4b, but not limited. The depth and size of the upper through holes 34 and the lower through holes 36 may be adjusted according to the depth and size specification of the chip mounting areas 32 or other requirements. In the present embodiment, the lower through holes 36 may also be formed by the above mentioned anisotropic wet etching process, but not limited. In addition, each of the through holes is not limited to be formed by an upper through hole 34 and a lower through hole 36, it may be other structure or formed by other methods. For instance, the lower through holes 36 may have vertical side walls as shown in FIG. 4c formed by an anisotropic wet etching process. In comparison with the lower through holes 36 having the inclined side walls, the lower through holes 36 having vertical side walls are smaller in size, which may lead to increase of integration. The trough holes may also be formed by directly etching through the package substrate 30 from either the upper surface or the lower surface of the package substrate 30.

Figure 5A:
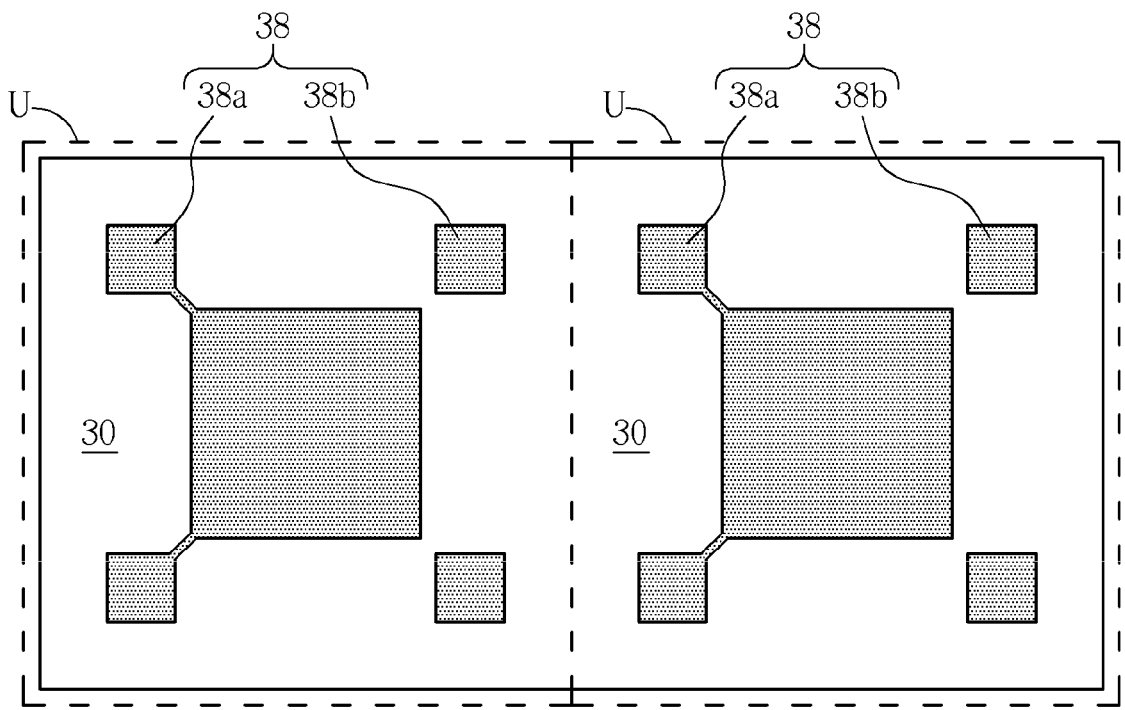
Figure 5B:
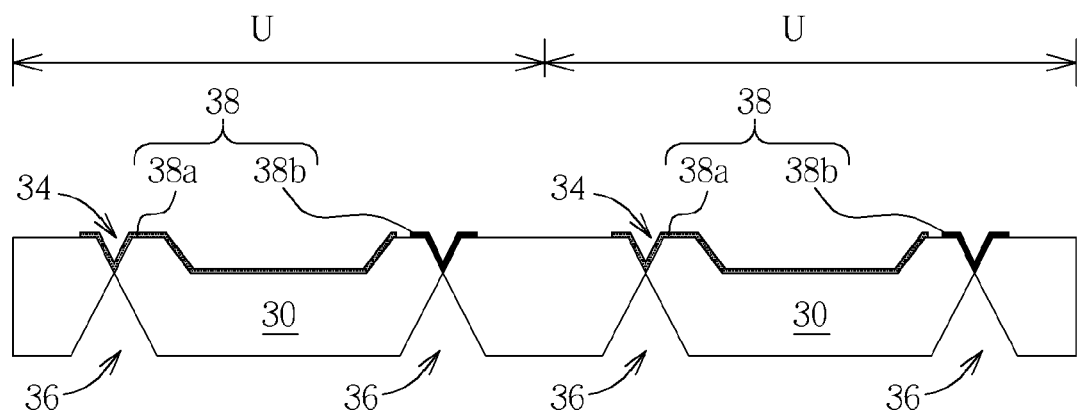

As shown in FIG. 5a and FIG. 5b, a lower patterned conductive layer 38 is formed on the upper surface of the package substrate 30. The lower patterned conductive layer 38 includes a plurality of first lower patterned conductive layers 38a and a plurality of second lower patterned conductive layers 38b. Each of the first lower patterned conductive layers 38a is formed in at least a portion of the corresponding chip mounting area 32 and is extended to fill in a portion of the upper through holes 34 within the corresponding unit U. Each of the second lower patterned conductive layers 38b is not formed in the corresponding chip mounting area 32, and is not either electrically connected to the corresponding first lower patterned conductive layer 38a. Each of the second lower patterned conductive layers 38b, however, is filled into other upper through holes 34 within the corresponding unit U. The lower patterned conductive layer 38 is served as conductive wire. The material of the lower patterned conductive layer 38 may be any single material such as silver, or a complex material such as alloys of gold and tin with good electrical conductivity. The thickness of the lower patterned conductive layer 38 may be 2 μm for example, but is not limited. Furthermore, the fabrication of the lower patterned conductive layer 38 may be carried out by different types of thin film techniques based on the material characteristic. For instance, the lower patterned conductive layer 38 may be formed by electroplating, electroless plating, deposition, etc, and patterned by photolithography and etching technique. In the present embodiment, the external connection of the LED chip is implemented on the lower surface of the package substrate 30 by conveying the electricity of the LED chip to the lower surface of the package substrate 30 via the through holes. Thus, the first lower patterned conductive layer 38a and the second lower patterned conductive layer 38b are filled into different upper through holes 34 within the corresponding unit U. In other embodiments without disposing the through holes, the first lower patterned conductive layers 38a and the second lower patterned conductive layers 38b must stay electrically disconnected.

Figure 6A:
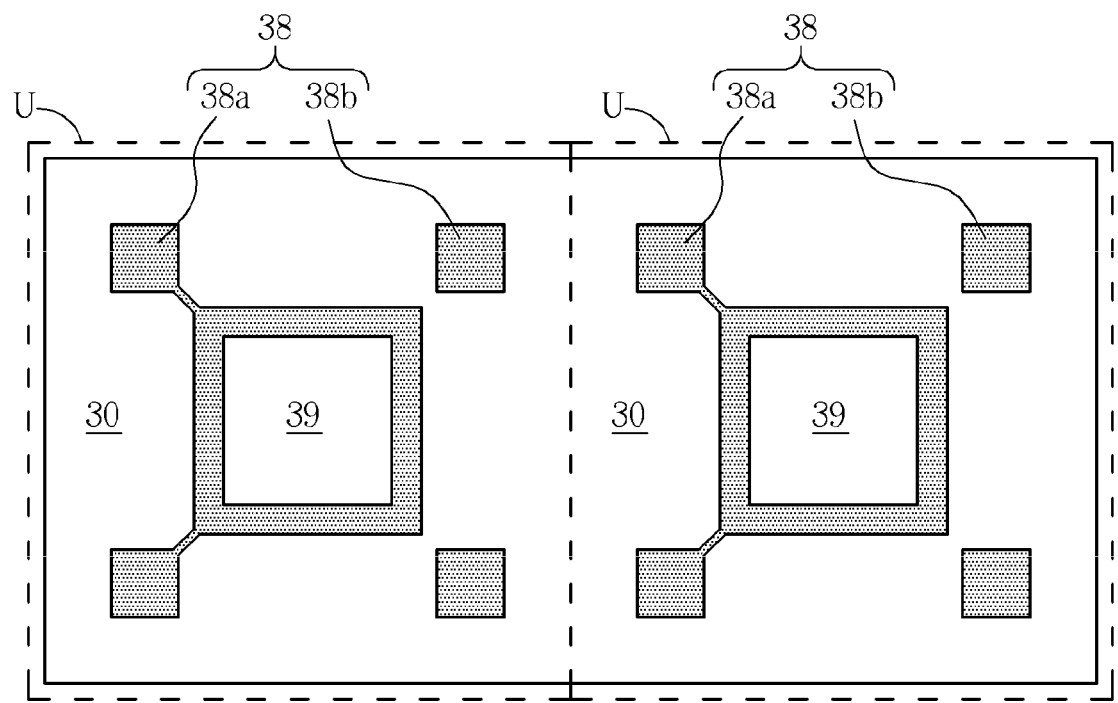
Figure 6B:
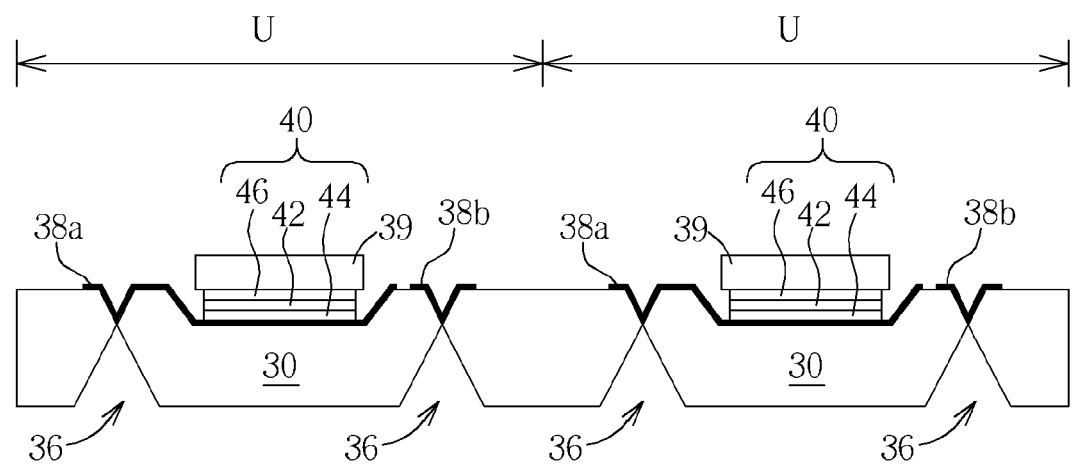

As shown in FIG. 6a and FIG. 6b, a plurality of LED chips 40 are then provided. The LED chips 40 in the present embodiment are vertical type chips. Each of the LED chips 40 is fabricated on an element substrate 39, for example a sapphire substrate. A second conductive type doped semiconductor layer 46, a light emitting layer 42, and a first conductive type doped semiconductor layer 44 are epitaxially formed on the element substrate 39 in sequence. Preferably, the LED chips 40 in the present embodiment are blue light LED chips, and may collocate with a fluorescent layer that produce yellow light to be formed successively to form white light by light-mixing. Therefore, the materials of the light emitting layer 42 may be semiconductor material that may emit blue light such as gallium nitride (GaN), and the material of the doped semiconductor layer may be GaN or other appropriate materials. The LED chips 40 are not limited to blue light LED chips, and may be other suitable LED chips, made of suitable material, that meet other requirements. In the present embodiment, the first conductive type doped semiconductor layer 44 is a P-type doped semiconductor layer, and the second conductive type doped semiconductor layer 46 is an N-type doped semiconductor layer, but not limited. In addition, to increase the efficiency of light extraction of the LED chips 40, micro-protrusions may further be fabricated on the surface of the second conductive type doped semiconductor layer 46. Besides, in order to increase the illumination efficiency or meet other requirements, the LED chips 40 may further include other common film layers such as injection layers or transport layers. Next, a chip mounting process is carried out. Each of the LED chips 40 is mounted onto each of the chip mounting areas 32, and the first conductive type doped semiconductor layer 44 of each of the LED chips 40 is electrically connected to each of the first lower patterned conductive layers 38a of the lower patterned conductive layer 38. The bonding of the LED chips 40 and the lower patterned conductive layer 38 may be realized by for example electrical conductive films, eutectic bonding, or other methods.

Figure 7A:
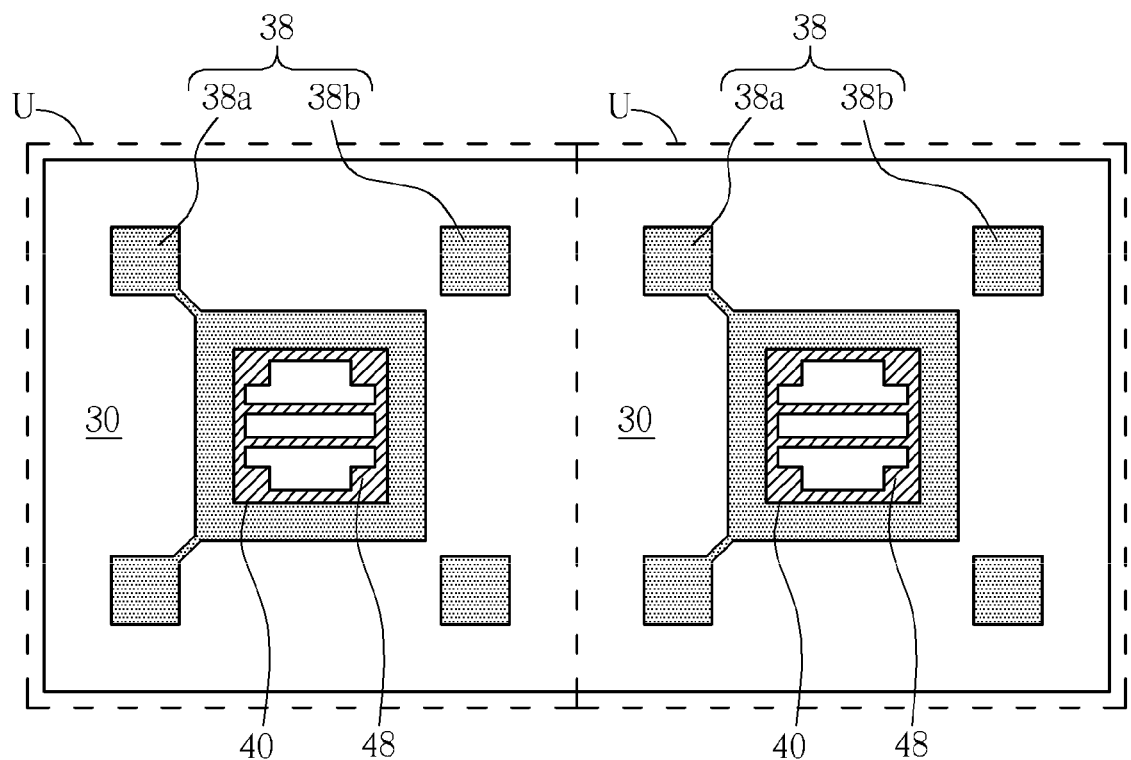
Figure 7B:
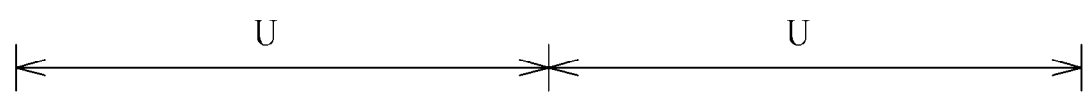
Figure 7B:
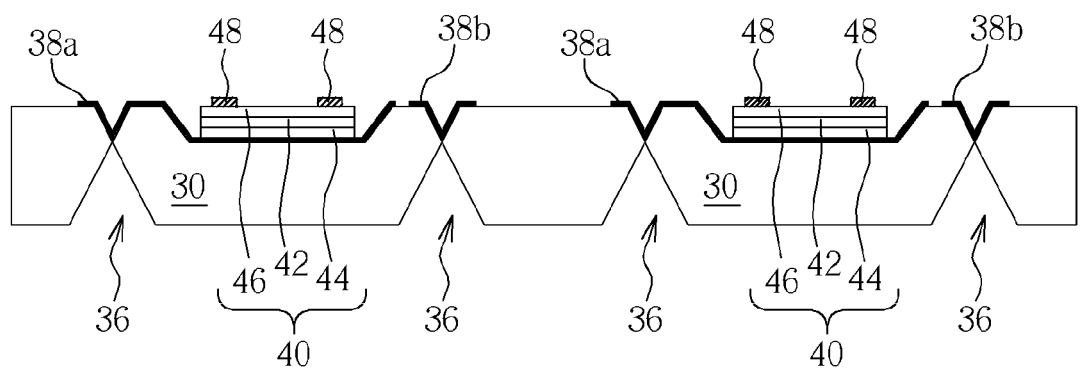

As shown in FIG. 7a and FIG. 7b, the element substrate 39 is then removed, so that the LED chips 40 are immobilized within the chip mounting areas 32. A connecting pads 48 may be selectively formed on the surface of the first conductive type doped semiconductor layer 44 or/and the surface of the second conductive type doped semiconductor layer 46 according to different electrical requirements. As described, the depth of the chip mounting areas 32 and the thickness of the LED chips 40 are close (for example falls in between 10 μm to 50 μm), and therefore the package substrate 30 and the upper surface of the LED chips 40 are substantially in the same plane. This facilitates the fabrications of film layers to be formed.

Figure 8A:
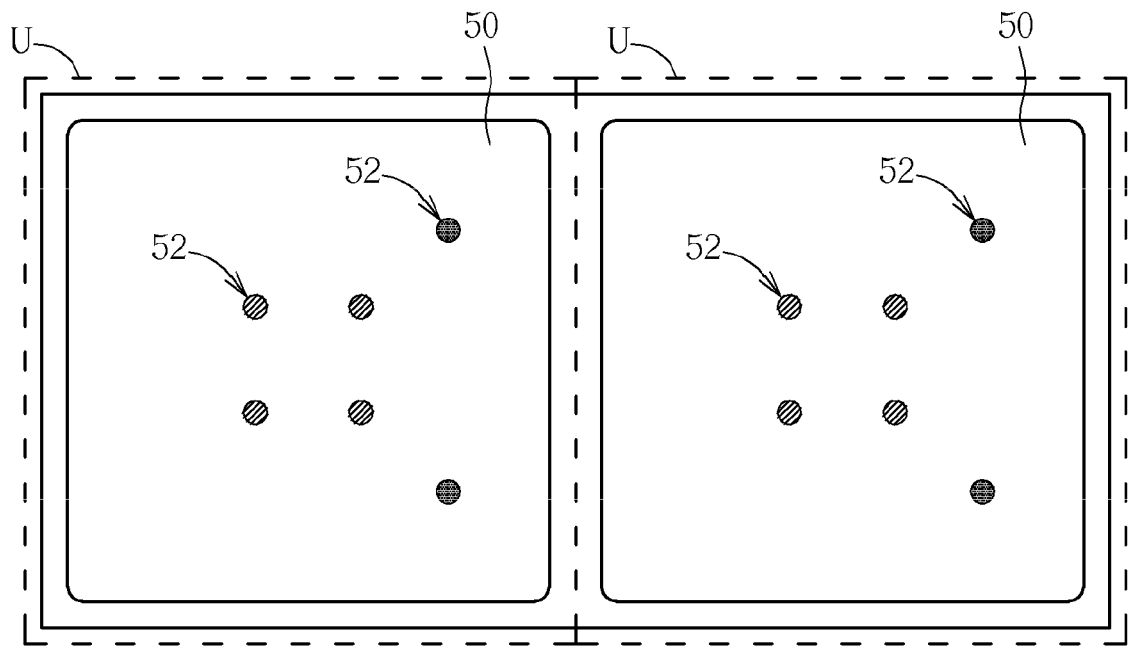
Figure 8B:
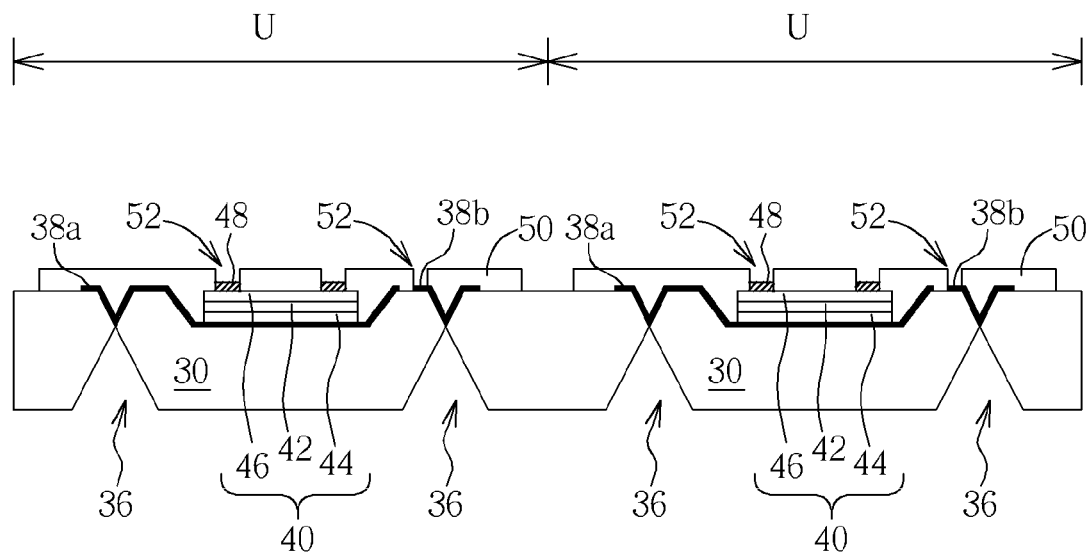

As shown in FIG. 8a and FIG. 8b, a planarization structure 50 is formed on the package substrate 30, the lower patterned conductive layer 38 and the LED chips 40. The planarization structure 50 is dielectric and is filled into the spaces between the LED chips 40 and the chip mounting areas 32, and consequently a complete plane is formed on the package substrate 30 and the upper surface of the LED chips 40, which makes it easy to form successive conductive wires thereon. Subsequently, a plurality of contact holes 52 are formed in the planarization structure 50, wherein a portion of the second conductive type doped semiconductor layer 46 of the LED chips 40 or the connecting pad 48 (if exists), and each of the second lower patterned conductive layers 38b of the lower patterned conductive layer 38 are exposed by the contact holes 52. In the present embodiment, the planarization structure 50 may be made of photosensitive material (such as photoresist), which may be formed by spin coating and patterned by exposure and development technique. However, the material and the formation of the planarization structure 50 are not limited. For instance, the planarization structure 50 may be made of other materials and may be patterned by photolithography and etching technique.

Figure 9A:
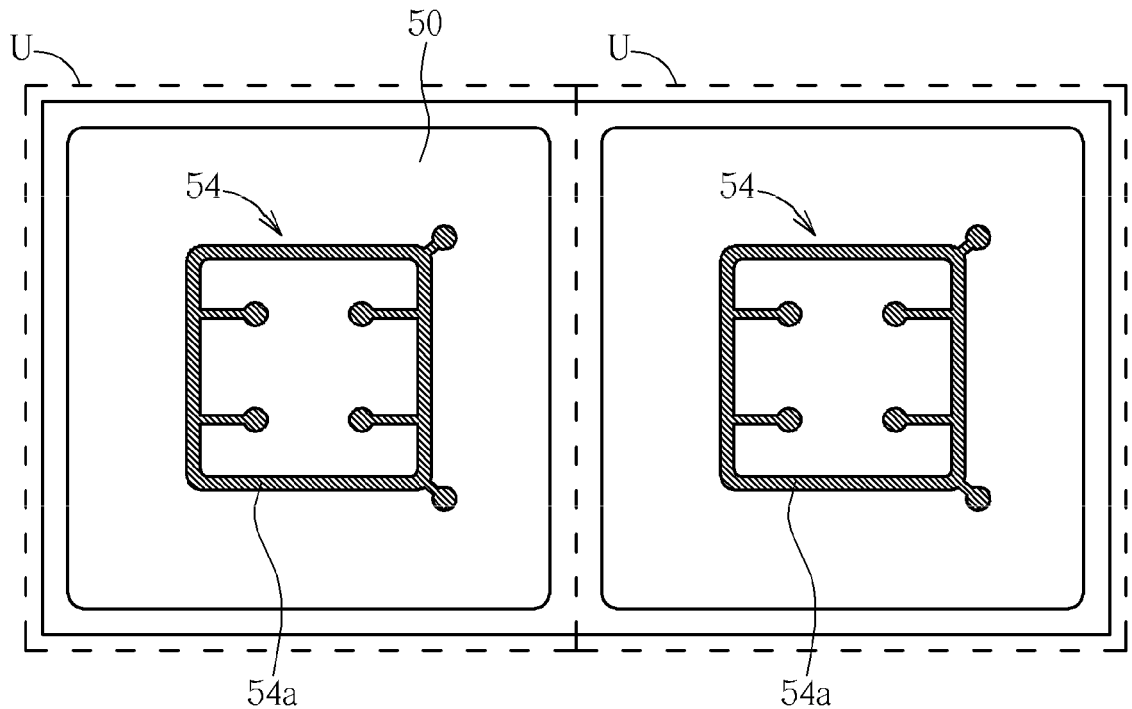
Figure 9B:
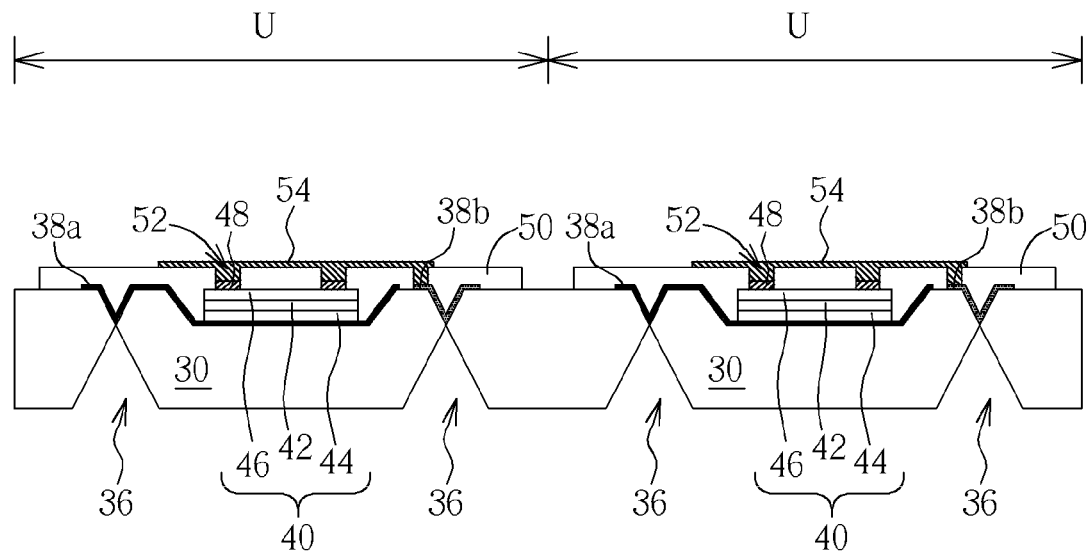

As shown in FIG. 9a and FIG. 9b, an upper patterned conductive layer 54 is formed on the planarization structure 50. The upper patterned conductive layer 54 is filled into the contact holes 52, so that each of the second lower patterned conductive layers 38b of the lower patterned conductive layer 38 is electrically connected to the second conductive type doped semiconductor layer 46 or the connecting pad 48 (if exists) of each of the LED chips 40 via the upper patterned conductive layer 54. Preferably, the upper patterned conductive layer 54 includes a plurality of web electrode patterns 54a in the present embodiment, and each of web electrode patterns 54a is corresponding to each of the chip mounting areas 32. Each of the web electrode patterns 54a has a circular pattern; this design enables the electric potential at each point of the circular pattern to be the same. Hence, current is uniformly injected into the LED chips 40, and therefore the uniformity of light illumination is improved. The function of the upper patterned conductive layer 54 is the same as that of the lower patterned conductive layer 38, which is also served as the wire. Thus, the material may be any single material or a complex material with good electrical conductivity, and the upper patterned conductive layer 54 may be formed by any kinds of thin film technologies depending on the selected material.

Figure 10A:
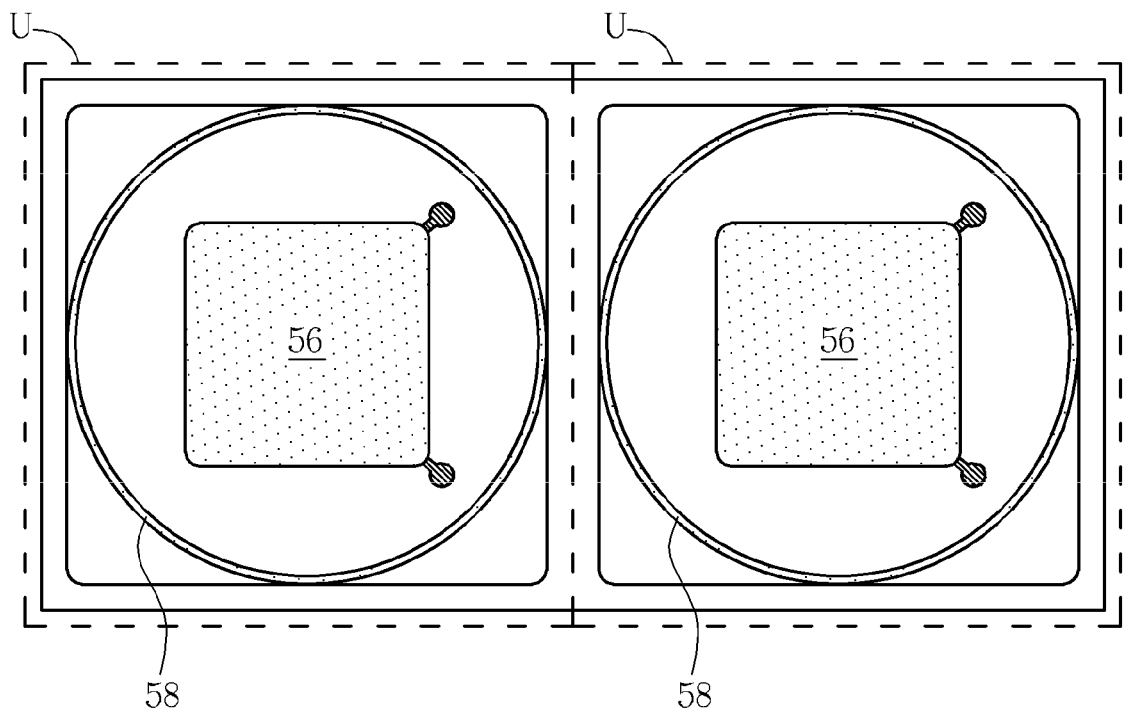
Figure 10B:
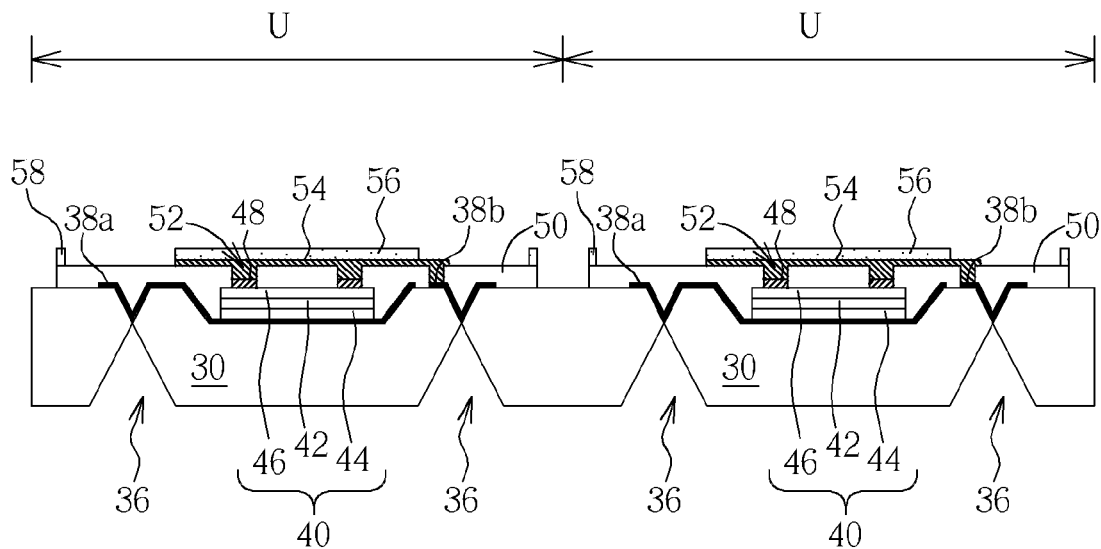

As shown in FIG. 10a and FIG. 10b, a plurality of fluorescent patterns 56 are formed on the planarization structure 50 and the upper patterned conductive layer 54. Each of the fluorescent patterns 56 is located within each unit U and is substantially corresponding to each of the chip mounting areas 32. The function of the fluorescent patterns 56 is to transform a portion of the light emitted by the LED chips 40 into the light of another color. For instance, the LED chips 40 in the present embodiment are blue light LED chips, thus fluorescent materials able to generate yellow light may be used as the fluorescent patterns 56. White light may be therefore produced by mixing blue light and yellow light. The fluorescent patterns 56 may be made of photosensitive material doped with fluorescent powder, and formed by lithography and etching technique, but the material and fabrication are not limited. In addition, a plurality of closed circular patterns 58 are formed on the planarization structure 50, and each of the closed circular patterns 58 surrounds each of the chip mounting areas 32. The closed circular patterns 58 have a certain thickness, for instance, several micrometers, and the closed circular patterns 58 have different surface characteristics from the planarization structure 50, for example one is hydrophilic and the other is hydrophobic. The function of the closed circular patterns 58 is to maintain the surface tension of the encapsulation to be formed subsequently. The surface tension renders the encapsulation to have a hemisphere shape, and the hemisphere shape enables the encapsulation to be an optical lens. In the present embodiment, the closed circular patterns 58 and the fluorescent patterns 56 are preferably made of the same photosensitive material, and formed by the same lithography exposure and development process. In such a manner, the fabrication is simplified. However, this is not a limitation of the method in the present invention.

Figure 11A:
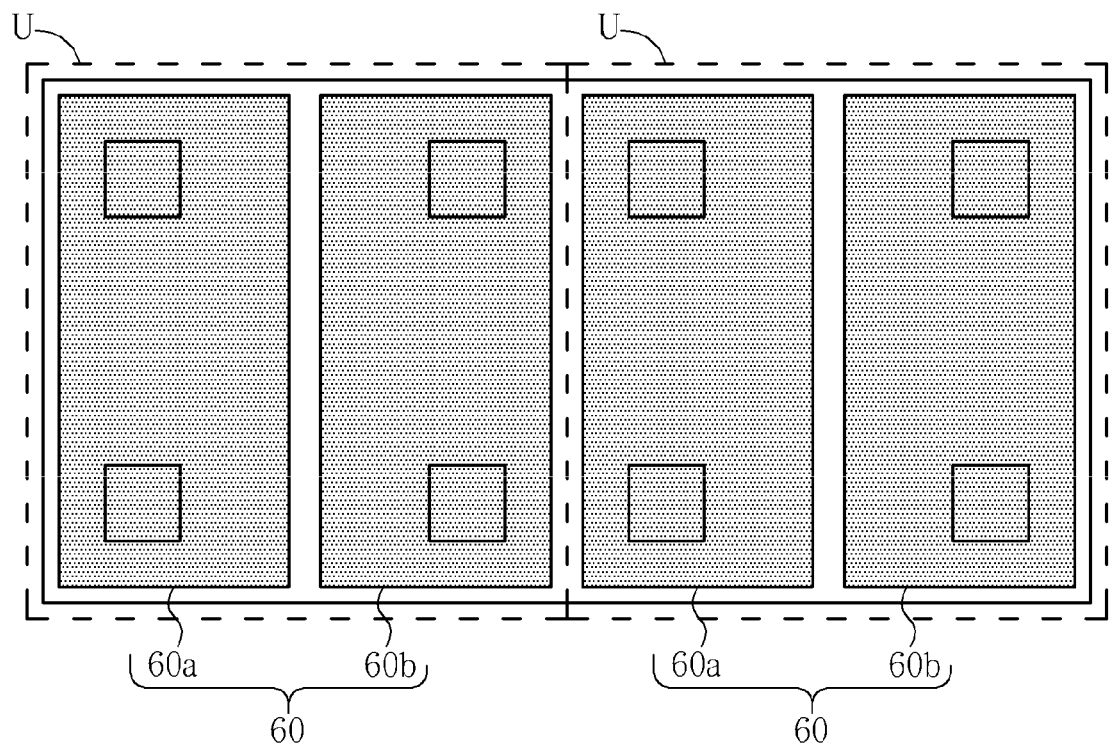
Figure 11B:
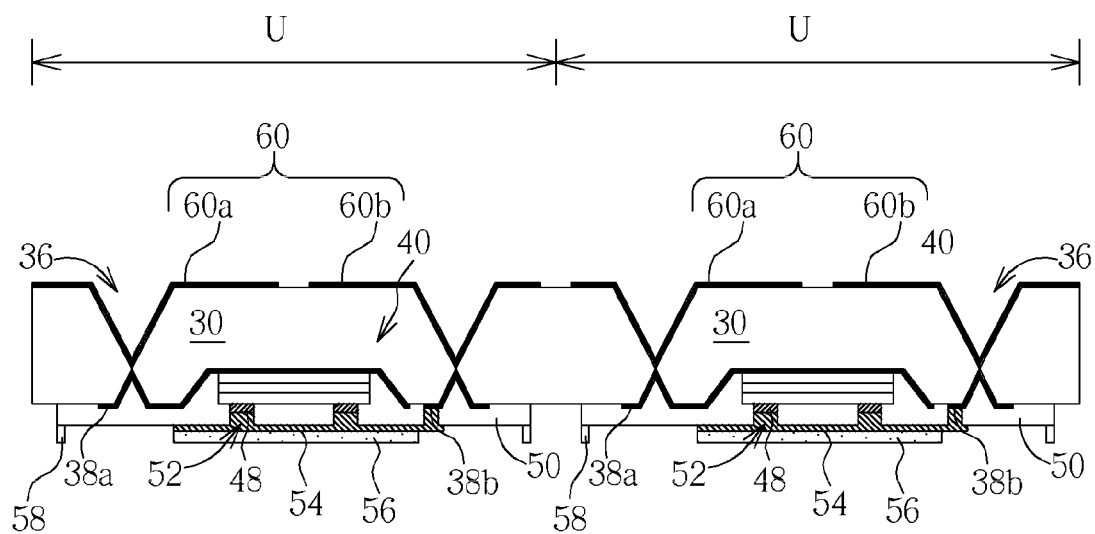

As shown in FIG. 11a and FIG. 11b, since the external electrical connection of the LED chip package of the present embodiment may be fulfilled on the lower surface of the package substrate 30, the method in the present invention may include the step of fabricating a back patterned conductive layer. The step of fabricating the back patterned conductive layer is not limited in particular order, and may be altered according to different process requirements. The step of fabricating the back patterned conductive layer is detailed as follows. A back patterned conductive layer 60 is formed on the lower surface of the package substrate 30, and filled into the lower through holes 36. The back patterned conductive layer 60 includes a plurality of first back patterned conductive layers 60a and a plurality of second back patterned conductive layers 60b. In each of the unit U, the first back patterned conductive layer 60a and the second back patterned conductive layer 60b are electrically disconnected. Each of the first back patterned conductive layer 60a is filled into a portion of the lower through holes 36 and is therefore electrically connected to the first lower patterned conductive layer 38a filled in the corresponding upper through holes 34. Each of the second back patterned conductive layers 60b is filled into the other lower through holes 36 and is therefore electrically connected to the second lower patterned conductive layer 38b filled in the corresponding upper through holes 34. Accordingly, the connecting terminals of the LED chips 40 may be transferred from the upper surface to the lower surface of the package substrate 30 via the design of the through holes and the back patterned conductive layer 60. This facilitates the implementation of external electrical connection to be done subsequently. In addition, the heat produced by the LED chips 40 during light emission will be downwardly conducted to the bottom directly through the package substrate 30, and dissipated. The electricity of the LED chips 40 is transferred to the back patterned conductive layer 60 via the upper patterned conductive layer 54 and the lower patterned conductive layer 38 through the through holes located in the periphery of the chip mounting areas 32. The design of separating the transmission of heat and electricity is in favor of enhancing the heat dissipation effect and the illumination efficiency of the LED chips 40.

Figure 12A:
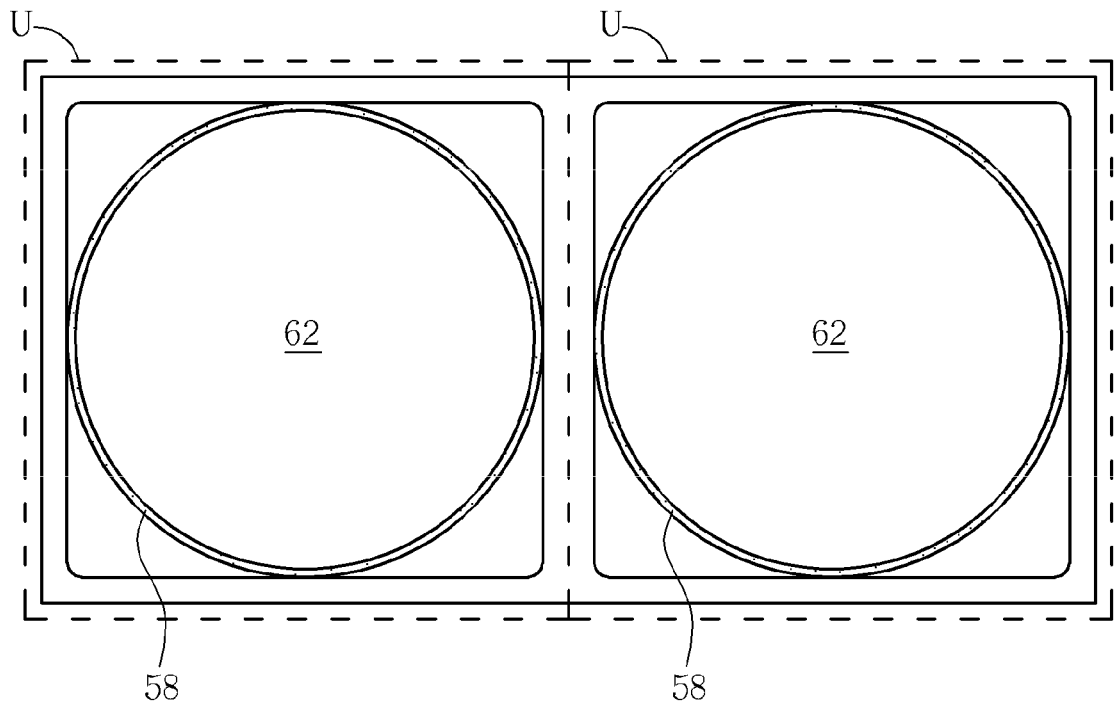
Figure 12B:
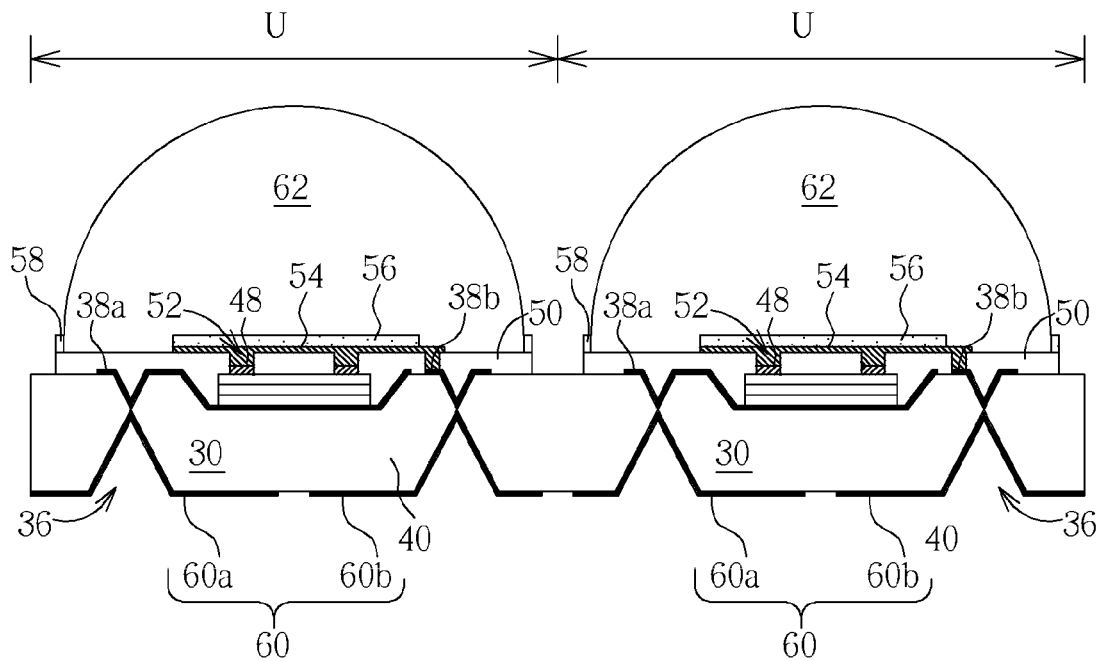

As shown in FIG. 12a and FIG. 12b, a glue dispensing process is then performed. An encapsulation 62 is formed on each of the fluorescent patterns 56 within each unit U. The surface tension of the encapsulation 62 is maintained by the existence of the closed circular pattern 58, and the shape of the encapsulation 62 becomes hemisphere. The encapsulation 62 will form an optical lens after solidified. Subsequently, a segmentation process is performed to form a plurality of LED chip packages.

Figure 13A:
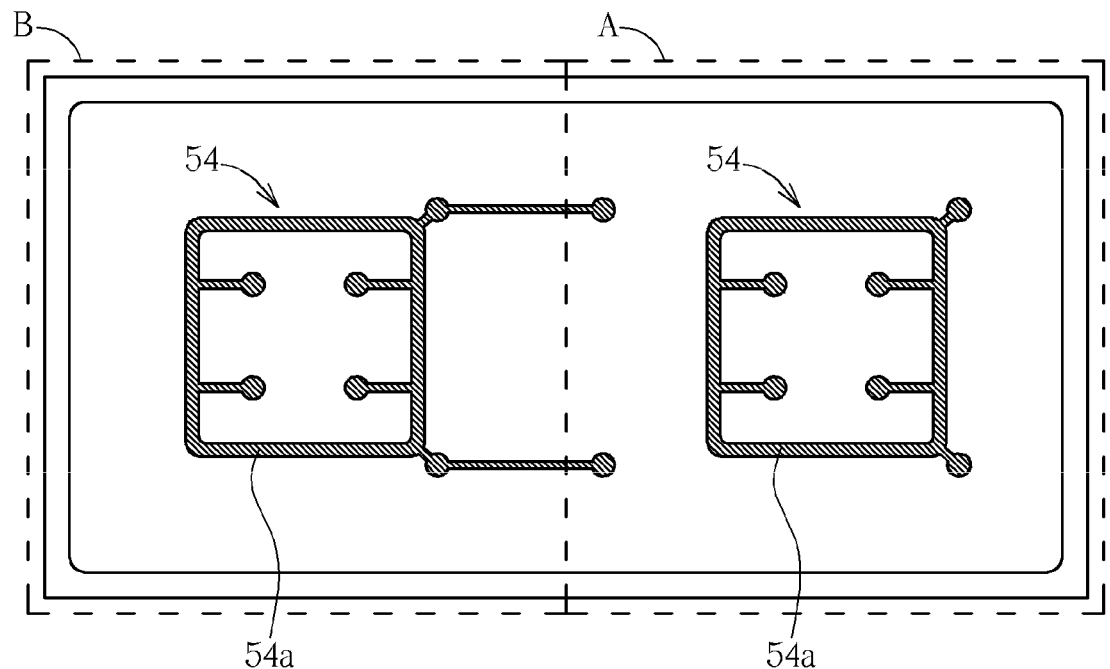
FIG. 13 is a schematic view illustrating electrical connection of a plurality of LED chips in series in the present invention.
Figure 13B:
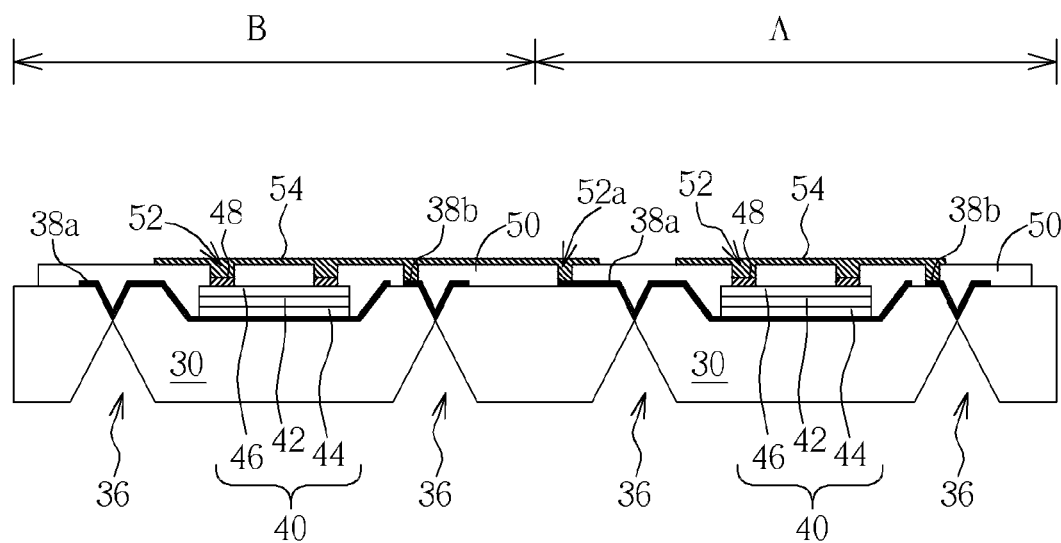

The planarization structure 50 in the LED chip package of the present invention enables fabrication of the planar upper patterned conductive layer 54 formed by planar technique. The planar upper patterned conductive layer 54 of the present invention is able to implement electrical connection between multiple LED chips 40 by altering the patterns of the upper patterned conductive layer 54 and the contact holes 52 of the planarization structure 50. Please refer to FIG. 13. FIG. 13 is a schematic view illustrating electrical connection of a plurality of LED chips in series in the present invention. FIG. 13a is a top view, while FIG. 13b is a cross-sectional view. The serial electrical connection of the LED chips 40 are realized by redesigning the pattern of the planarization structure 50 and the upper patterned conductive layer 54, and an example of serially connecting two adjacent LED chips 40 is illustrated as follows. As shown in FIG. 13a and FIG. 13b, when patterning the planarization structure 50, at least a contact hole 52a in addition to the original contact holes 52 are formed in the planarization structure 50 of an unit A. The contact hole 52a exposes the first lower patterned conductive layer 38a. Next, the upper patterned conductive layer 54 of an adjacent unit B is filled into the contact holes 52 of itself (unit B). The upper patterned conductive layer 54 is also extended to the unit A and inserted into the contact hole 52a, so that the two LED chips 40 of the units A, B are electrically connected to each other in series. In this embodiment, two LED chips are illustrated as an example of the present invention, but the number of the LED chips to be electrically connected in series is not limited and may be altered according to different requirements.

Figure 14A:
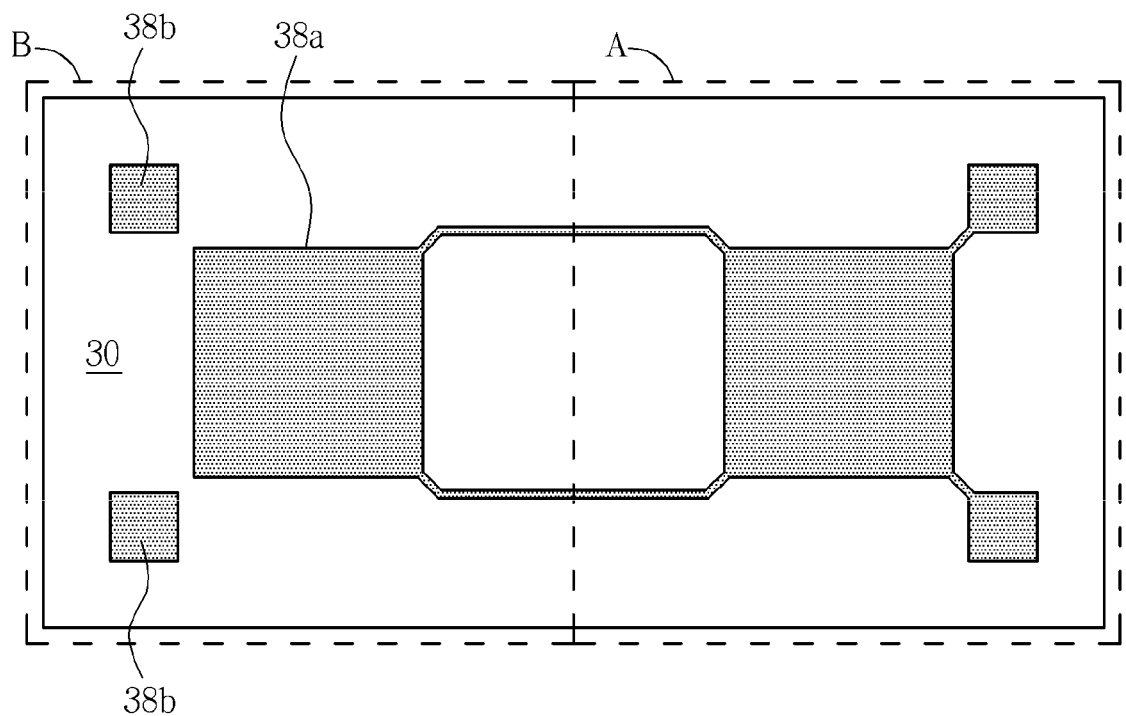
FIG. 14 and FIG. 15 are schematic views illustrating electrical connection of a plurality of LED chips in parallel in the present invention.
Figure 14B:
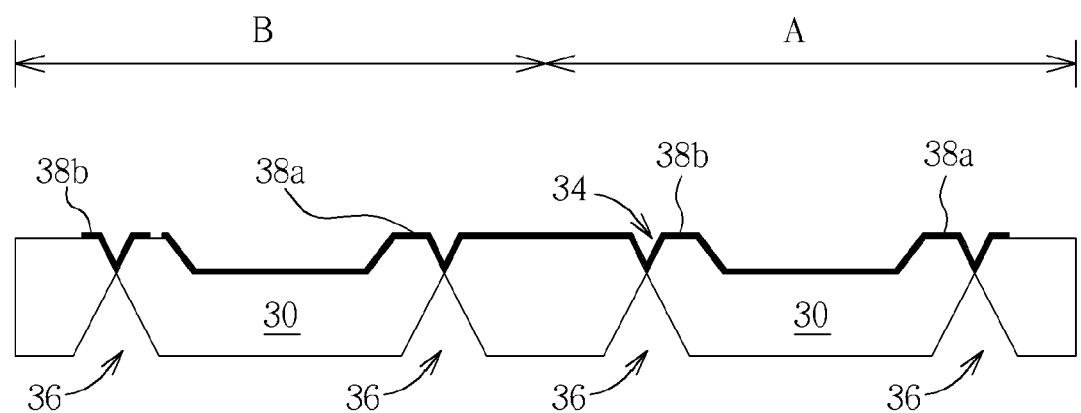
Figure 15A:
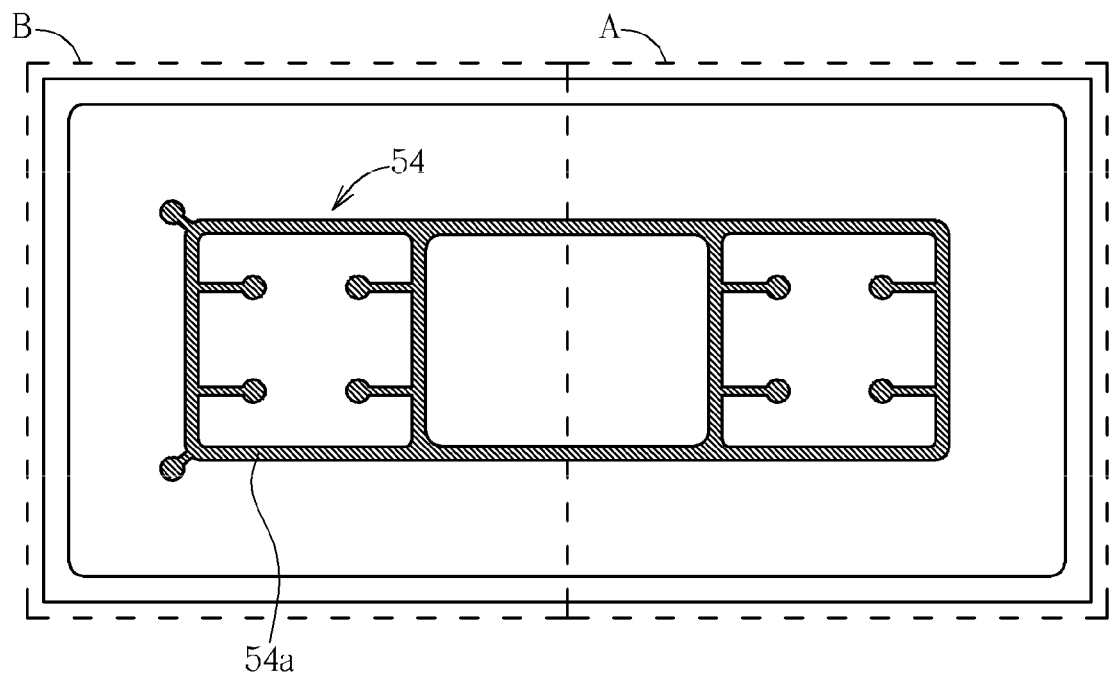
Figure 15B:
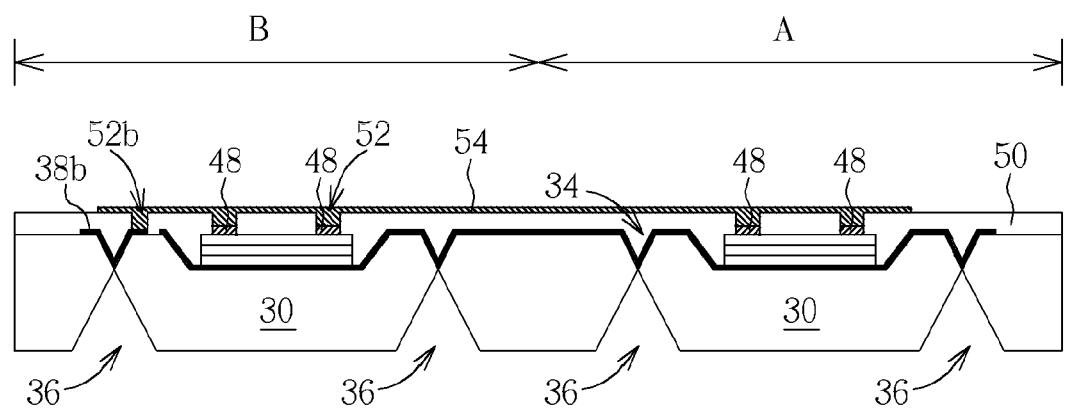

Please refer to FIG. 14 and FIG. 15. FIG. 14 and FIG. 15 are schematic views illustrating electrical connection of a plurality of LED chips in parallel in the present invention. FIG. 14*a* and FIG. 15*a* are top views, and FIG. 14*b* and FIG. 15*b* are cross-sectional views. The parallel electrical connection of the LED chips 40 are realized by redesigning the lower patterned conductive layer 38, the pattern of the planarization structure 50 and the upper patterned conductive layer 54, and an example of connecting two adjacent LED chips 40 in parallel is illustrated as follows. First, as shown in FIG. 14*a* and FIG. 14*b*, when patterning the lower patterned conductive layer 38, the first lower patterned conductive layer 38*a* of a unit A, the second lower patterned conductive layers 38*b* of the unit A, and also the first lower patterned conductive layer 38*a* of an adjacent unit B are electrically connected. Next, as shown is FIG. 15*a* and FIG. 15*b*, after mounting the LED chips 40 into the chip mounting areas 32 respectively, the planarization structure 50 is formed on the package substrate 30, the lower patterned conductive layer 38 and the LED chips 40. The planarization structure 50 has a plurality of contact holes 52, which expose a portion of the second conductive type doped semiconductor layer 46 or the connecting pad 48 (if exists), and at least a contact hole 52*b* which exposes the second lower patterned conductive layers 38*b*. Subsequently, the upper patterned conductive layer 54 is formed on the planarization structure 50. The upper patterned conductive layer 54 is filled into the contact holes 52 of the units A, B, and is also filled into the contact holes 52*b* of the unit B, so that the two LED chips 40 of the units A, B are electrically connected to each other in parallel. In this embodiment, two LED chips are illustrated as an example of the present invention, but the number of the LED chips to be electrically connected in parallel is not limited and may be altered according to different requirements.

In sum, the LED chip package and the method of fabricating thereof in the present invention have the advantages as listed:

1. The package method in the present invention is a wafer level production method, and therefore is advantageous for its capability of batch production.
2. The LED chip package in the present invention utilizes semiconductor substrate having good heat dissipation ability as a package substrate.
3. The package substrate in the present invention has the design of through holes and back patterned conductive layer, which enables to convey the connecting terminals of the LED chip from the upper surface to the lower surface of the package substrate, thus increasing the convenience to implement external connection.
4. The heat dissipation of the LED chip package in the present invention is carried out through the package substrate in the bottom of the chip mounting area, and the electricity transmission is delivered through the through holes located in the periphery of the chip mounting area and the back patterned conductive layer, hence, having the advantage of separating the transmission of heat and electricity.
5. The depth of the chip mounting areas of the LED chip package matches the thickness of the LED chips in the present invention, and the planarization structure is further filled into the space between the LED chips and the side walls of the chip mounting areas. Consequently, the package substrate has a planar surface after chip mounting, and this planar surface enables the layout of planar patterned conductive layer to be implemented.
6. The LED chip package in the present invention utilizes the planar patterned conductive layer as the connection layer, enabling the LED chips to electrically connect to each other in series and in parallel easily.
7. The LED chip package in the present invention has the design of web electrode pattern, which enables current to be uniformly injected to the LED chips, increasing the uniformity of light.
8. The LED chip package in the present invention has the design of closed circular pattern, enabling the maintenance of the surface tension of the encapsulation to be formed. Consequently, fabrication of lens may be performed easily.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a light emitting diode (LED) chip package, comprising:
    providing a package substrate, and forming a plurality of concave chip mounting areas on an upper surface of the package substrate;
    forming a lower patterned conductive layer on the upper surface of the package substrate, wherein the lower patterned conductive layer comprises a plurality of first lower patterned conductive layers and a plurality of second lower patterned conductive layers;
    providing a plurality of LED chips, each of the LED chips comprising a light emitting layer, a first conductive type doped semiconductor layer disposed on a lower surface of the light emitting layer, and a second conductive type doped semiconductor layer disposed on an upper surface of the light emitting layer;
    mounting each of the LED chips within each of the chip mounting areas, and electrically connecting the first conductive type doped semiconductor layer of each of the LED chips to each of the first lower patterned conductive layers of the lower patterned conductive layer;
    forming a planarization structure on the package substrate, the lower patterned conductive layer and the LED chips, and forming a plurality of contact holes in the planarization structure, wherein the contact holes partially expose the second conductive type doped semiconductor layer of each of the LED chips and partially expose each of the second lower patterned conductive layers of the lower patterned conductive layer; and
    forming an upper patterned conductive layer on the planarization structure and filling the upper patterned conductive layer into the contact holes so that each of the second lower patterned conductive layers of the lower patterned conductive layer and the second conductive type doped semiconductor layer of each of the LED chips are electrically connected via the upper patterned conductive layer.

2. The method of claim 1, wherein the package substrate comprises a semiconductor substrate.

3. The method of claim 1, further comprising forming a plurality of through holes in the package substrate before forming the lower patterned conductive layer on the upper surface of the package substrate, and electrically connecting the lower patterned conductive layer to a lower surface of the package substrate via the through holes.

4. The method of claim 3, wherein the step of forming the through holes in the package substrate comprise:
  forming a plurality of upper through holes on the upper surface of the package substrate; and
  forming a plurality of lower through holes on the lower surface of the package substrate, wherein the upper through holes and the lower through holes correspond to each other, forming the through holes.

5. The method of claim 4, wherein the step of electrically connecting the lower patterned conductive layer to the lower surface of the package substrate via the through holes comprise:
  forming a back patterned conductive layer on the lower surface of the package substrate and filling the back patterned conductive layer into the lower through holes; and
  filling the lower patterned conductive layer into the upper through holes and electrically connecting the lower patterned conductive layer to the back patterned conductive layer.

6. The method of claim 4, wherein the upper through holes are formed by an anisotropic wet etching process.

7. The method of claim 6, wherein the chip mounting areas and the upper through holes are formed by the same anisotropic wet etching process.

8. The method of claim 4, wherein the lower through holes are formed by an anisotropic wet etching process.

9. The method of claim 1, wherein the depth of the chip mounting area and the thickness of the LED chip are substantially the same.

10. The method of claim 1, wherein the planarization structure comprises a photosensitive material layer.

11. The method of claim 1, wherein the upper patterned conductive layer comprises a plurality of web electrode patterns corresponding to the chip mounting areas respectively.

12. The method of claim 1, wherein the step of forming the upper patterned conductive layer further comprises electrically connecting the second conductive type doped semiconductor layer of the LED chip of a chip mounting area to the first lower patterned conductive layer of another chip mounting area via the upper patterned conductive layer, so that the two LED chips are electrically connected in series.

13. The method of claim 1, wherein the step of forming the upper patterned conductive layer further comprises electrically connecting the second conductive type doped semiconductor layer of the LED chip of a chip mounting area to the second lower patterned conductive layer of another chip mounting area via the upper patterned conductive layer, so that the two LED chips are electrically connected in parallel.

* * * * *